(12) United States Patent
Gervais et al.

(10) Patent No.: US 6,327,680 B1
(45) Date of Patent: Dec. 4, 2001

(54) METHOD AND APPARATUS FOR ARRAY REDUNDANCY REPAIR DETECTION

(75) Inventors: Gilles Gervais; Herman Reyes, both of Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/315,258

(22) Filed: May 20, 1999

(51) Int. Cl.<sup>7</sup> ...................................................... G06F 11/00
(52) U.S. Cl. ............................................. 714/711; 714/710
(58) Field of Search ..................................... 714/711, 710

(56) References Cited

U.S. PATENT DOCUMENTS 4,639,915 * 1/1987 Bosse .
5,689,466   11/1997 Qureshi .................................. 365/201
5,764,655   6/1998 Kirihata et al. ....................... 371/22.5
5,795,797 * 8/1998 Chester et al. .

* cited by examiner

*Primary Examiner*—Phung M. Chung
(74) *Attorney, Agent, or Firm*—Andrea P. Bryant; Robert M. Carvell

(57) ABSTRACT

An apparatus receives a series of locations containing a row address and a column address of a fault detected within an array. A row replacement priority circuit within the apparatus logs the row address of the first fault detected, and thereafter marks a column of any subsequent faults detected in rows other than the row of the first detected fault. Concurrently, a column replacement priority circuit within the apparatus logs the column address of the first fault detected, and thereafter marks a row of any subsequent faults detected in columns other than the column of the first detected fault.

14 Claims, 12 Drawing Sheets

FIG. 5A

| EXAMPLE REF | ROW PRIORITY | | | | | COLUMN PRIORITY | | | | | COMMENTS |
|---|---|---|---|---|---|---|---|---|---|---|---|
| | RPR | RV | RPC | CV | NR | CPR | RV | CPC | CV | NR | |
| A | 1 | 1 | X | 0 | 0 | X | 0 | 2 | 1 | 0 | |
| | 1 | 1 | 2 | 1 | 0 | X | 0 | 2 | 1 | 0 | |
| B | 1 | 1 | X | 0 | 0 | X | 0 | 2 | 1 | 0 | |
| | 1 | 1 | 3 | 1 | 0 | 2 | 1 | 2 | 1 | 0 | |
| C | 1 | 1 | X | 0 | 0 | X | 0 | 2 | 1 | 0 | |
| | 1 | 1 | 3 | 1 | 1 | 2 | 1 | 2 | 1 | 0 | |
| D | 1 | 1 | 3 | 1 | 0 | 2 | 1 | 2 | 1 | 0 | |
| | 1 | 1 | X | 0 | 0 | X | 0 | 2 | 1 | 0 | |
| E | 1 | 1 | 3 | 1 | 0 | X | 1 | 2 | 1 | 0 | |
| | 1 | 1 | 2 | 1 | 0 | X | 0 | 2 | 1 | 1 | |
| | 1 | 1 | 2 | 1 | 1 | 2 | 1 | 2 | 1 | 0 | |
| F | 1 | 1 | X | 0 | 0 | X | 0 | 2 | 1 | 0 | |
| | 1 | 1 | X | 0 | 0 | 1 | 1 | 2 | 1 | 0 | Best solution is Row Priority since col_valid is not set. |

FIG. 5B

| | | | | | | | | | | | | | | | | |
|---|---|---|---|---|---|---|---|---|---|---|---|---|---|---|---|---|
| G | 0 | 1 | 2 | | x | 0 | 0 | x | 1 | 1 | | | | | | |
| H | 0 | 1 | 2 | 1 | 1 | 0 | 0 | x | 1 | 1 | | | | | | |
| | | 1 | 2 | 1 | 1 | 0 | 1 | 5 | 1 | 1 | | | | | | |
| I | 0 | 1 | 2 | 0 | x | 0 | 0 | x | 1 | 1 | RP forced fail | | | | | |
| J | 0 | 1 | 2 | 1 | 1 | 0 | 0 | x | 1 | 1 | CP forced fail | | | | | |
| | | 1 | 2 | 1 | 1 | 0 | 1 | 2 | 1 | 1 | CP forced fail | | | | | |
| K | 0 | 0 | 2 | 0 | x | 1 | 0 | x | 1 | 1 | | | | | | |
| | 0 | 0 | x | 1 | 1 | 0 | 0 | x | 1 | 1 | | | | | | |
| | 0 | 0 | x | 1 | 1 | 0 | 0 | x | 1 | 1 | | | | | | |
| | 0 | 1 | 2 | 1 | 1 | 0 | 1 | 2 | 1 | 1 | CP forced fail | | | | | |
| | 0 | 1 | 2 | 1 | 1 | 0 | 1 | 2 | 1 | 1 | | | | | | |
| L | 0 | 0 | x | 1 | 1 | 0 | 0 | x | 1 | 1 | | | | | | |
| | 0 | 0 | x | 1 | 1 | 0 | 0 | x | 1 | 1 | | | | | | |
| | 0 | 1 | 6 | 1 | 1 | 0 | 1 | 6 | 1 | 1 | | | | | | |
| M | 0 | 0 | x | 1 | 1 | 0 | 0 | x | 1 | 1 | | | | | | |
| | 1 | 0 | x | 1 | 1 | 1 | 0 | x | 1 | 1 | | | | | | |

METHOD AND APPARATUS FOR ARRAY REDUNDANCY REPAIR DETECTION

BACKGROUND OF THE INVENTION

1. Technical Field

The present invention relates to arrays for storing data or other information, and more particularly to the repair of defective array cells.

2. Related Art

Modern electronic devices store data in a variety of places. For example, the typical main data memory for a computer system may have a variety of DIMMS (dual in line memory modules) or SIMMS (single in line memory modules) for storing data. Many computer systems have a data cache associated with each processor, also storing data in arrays. Various buffers and bridges throughout a computer system contain arrays for storing data such as DMA (direct memory access) devices or buffers between busses of different speeds or widths. Many peripheral devices, both on and off the system board, use arrays to store data.

Structure of Arrays

Arrays consist of memory locations arranged in rows and columns. Even when an array is not physically structured in rows and columns, the individual locations within the array may be addressed by a row address and a column address. For example, a memory protocol may receive an address across a very wide address bus, and divide the memory address into a row portion and a column portion for delivery to a particular memory array. Thus, many systems address memory locations within an array by a row address and a column address. Moreover, such systems typically use a very large number of arrays using such two-coordinate addressing schemes.

Structure of Defects

Unfortunately, during the manufacturing or other processes, memory arrays can contain defective locations. A defective location may have a "stuck at" fault, at which the memory location cannot be modified. Other faults, such as a "stuck to" fault are also found. "Stuck to" faults connect a memory location to an adjacent memory location, such that the faulty memory location always contains whatever data has been stored in the adjacent memory location and cannot be used independently. Many other faults will be apparent to anyone skilled in the art who has spent time working with arrays for storing data.

Frequency of Defects

As arrays become increasingly larger on processor chips, the percentage of manufacturing defects related to arrays also increases.

Overview of Array Repair

The process of determining how to repair defective cells in an array usually includes the following steps. The first step is to determine which bit cells are faulty by running an array built-in self test (ABIST). The second step is to determine if the array is repairable using spare cells. The number of spare cells may not be adequate to repair all array faults.

Structure of ABIST

Defective bits are normally encountered through an array built in self test (ABIST) process. ABIST engines create data and attempt to store the data in the memory array, and then attempt to read the data. If the data cannot be read, then a fail has been detected. ABIST engines detect the fail by comparing the data that is actually contained in the array location with an expected data value generated by the ABIST engines itself.

Structure of Redundancy

One of the common methods of correcting faults in a memory array is to provide row and column redundancy. Redundancy is provided by adding additional rows or columns to an array. When a defective bit within defective memory location is discovered in an array, thereafter all addresses to the row or column containing the fail are redirected to the replacement row or column.

There are two types of redundancy mechanisms that can be used. The first type is word line redundancy, also known as row replacement, which detects attempts to access a row containing a fail. Row replacement redirects detected accesses to spare row array cells in a replacement row. The second type is column redundancy, also known as column replacement, and detects attempts to access a column containing a fail. Column replacement redirects detected accesses to spare column array cells in a replacement column. Systems can use either type of redundancy mechanism, or both types simultaneously, to repair arrays.

Problems with Redundancy

Unfortunately, space limitations often limit the number of available replacement rows and columns, and assigning these to the various defective bits can easily be done suboptimally. For any given fail, either row replacement or column replacement may be used, and determining which replacement scheme is preferable often requires knowledge of other defective bits in the array.

For example, assigning a replacement column (thereby selecting column repair) might be the more appropriate repair scheme where several defective bits happen to be detected within the same column, since a single replacement column can be used to correct multiple defective bits. On the other hand, if several defective bits are detected in the same row of the array, a replacement row can be used, rather than attempting column repair on any of the detected defective bits.

Problems with Using ABIST for Redundancy

Knowledge of other faults, however, may be unavailable when a single fault is discovered. Although ABIST engines are used to detect faults or defective bits in arrays, they do so one fault at a time.

Consequently, present repair hardware or circuits that detect array faults when running ABIST generally do not determine the optimal repair methods for arrays that have both row redundancy and column redundancy.

BRIEF SUMMARY OF THE INVENTION

An apparatus receives a series of locations containing a row address and a column address of a fault detected within an array. A row replacement priority circuit within the apparatus logs the row address of the first fault detected, and thereafter marks a column of any subsequent faults detected in rows other than the row of the first detected fault. Concurrently, a column replacement priority circuit within the apparatus logs the column address of the first fault detected, and thereafter marks a row of any subsequent faults detected in columns other than the column of the first detected fault.

According to one aspect, the present invention includes detection of array defective bits; detection of multibit defective bits, which are individual rows having several defective bits; determination of whether an array is repairable; and where the array is repairable, determination the optimal repair method with a single pass of running ABIST.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION OF THE PREFERRED EMBODIMENT

Figure 1:
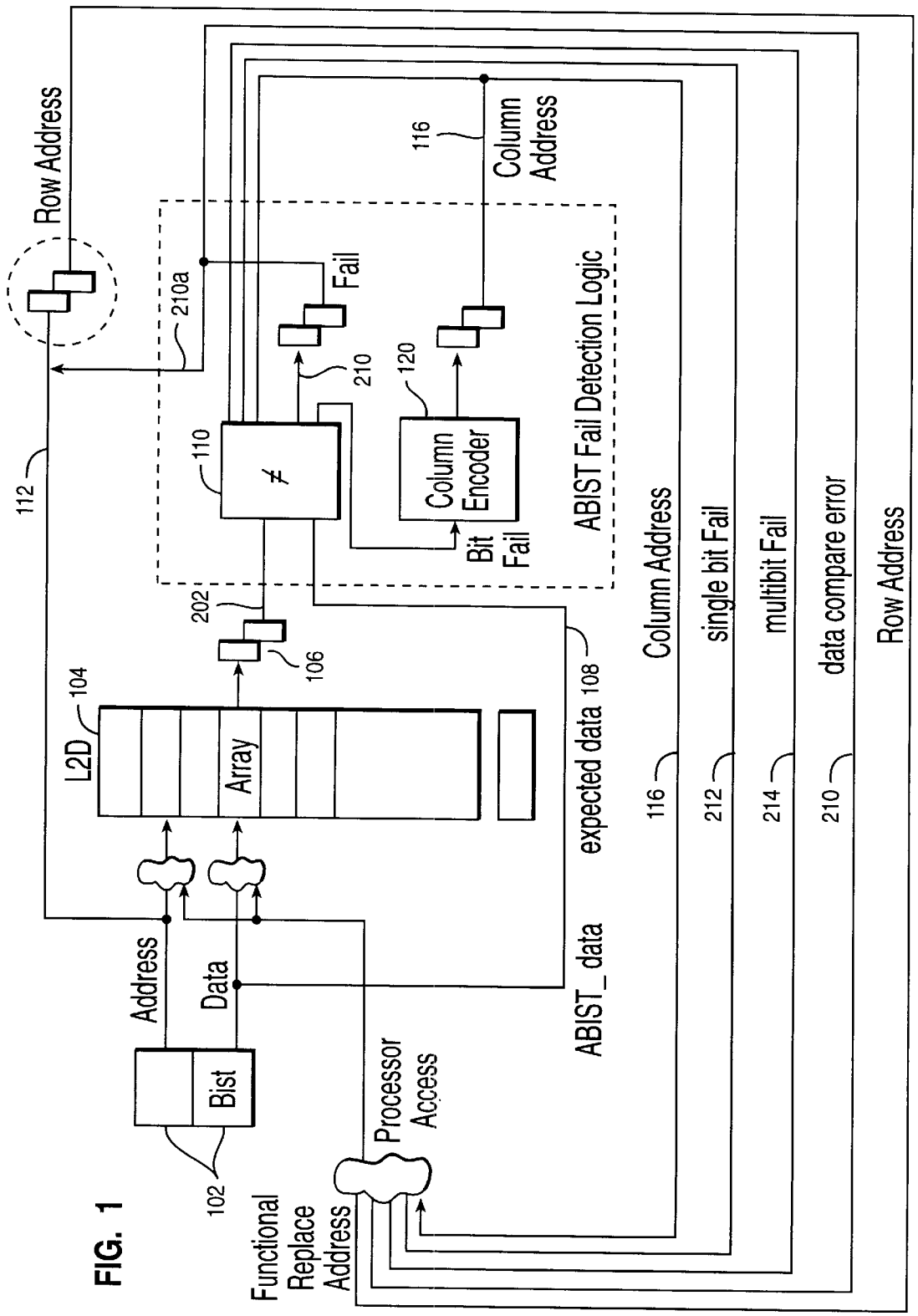
FIG. 1 shows a system level implementation of one embodiment of the present invention.

FIG. 1 shows a system level implementation of one embodiment of the present invention. An array 104, for example, a second level cache corresponding to a processor of a computer system, contains a large number of locations within the array. Each of the locations is uniquely addressable, and contains a predetermined number of bits. The array 104 may be used to store data, instructions, or a combination of various other types of information.

The array 104 is both writeable and readable by a built in self test subsystem. ABIST engine 102 of the built in self test subsystem is selectable in either a write or read mode. When the ABIST engine 102 is in write mode, the ABIST engine 102 generates data and an address, and provides the data and the address to the array 104 via an array controller. The array controller, upon receiving the address and data from the ABIST engine and determining that the ABIST engine 102 is in write mode, writes the data to the array location identified by the received address. When the ABIST engine 102 and array controllers are in read mode, however, the array controllers upon receiving the address ignore the data from the ABIST engine 102, access the array location identified by the ABIST address, and provide the data stored in such location to a latch 106.

Figure 3A:
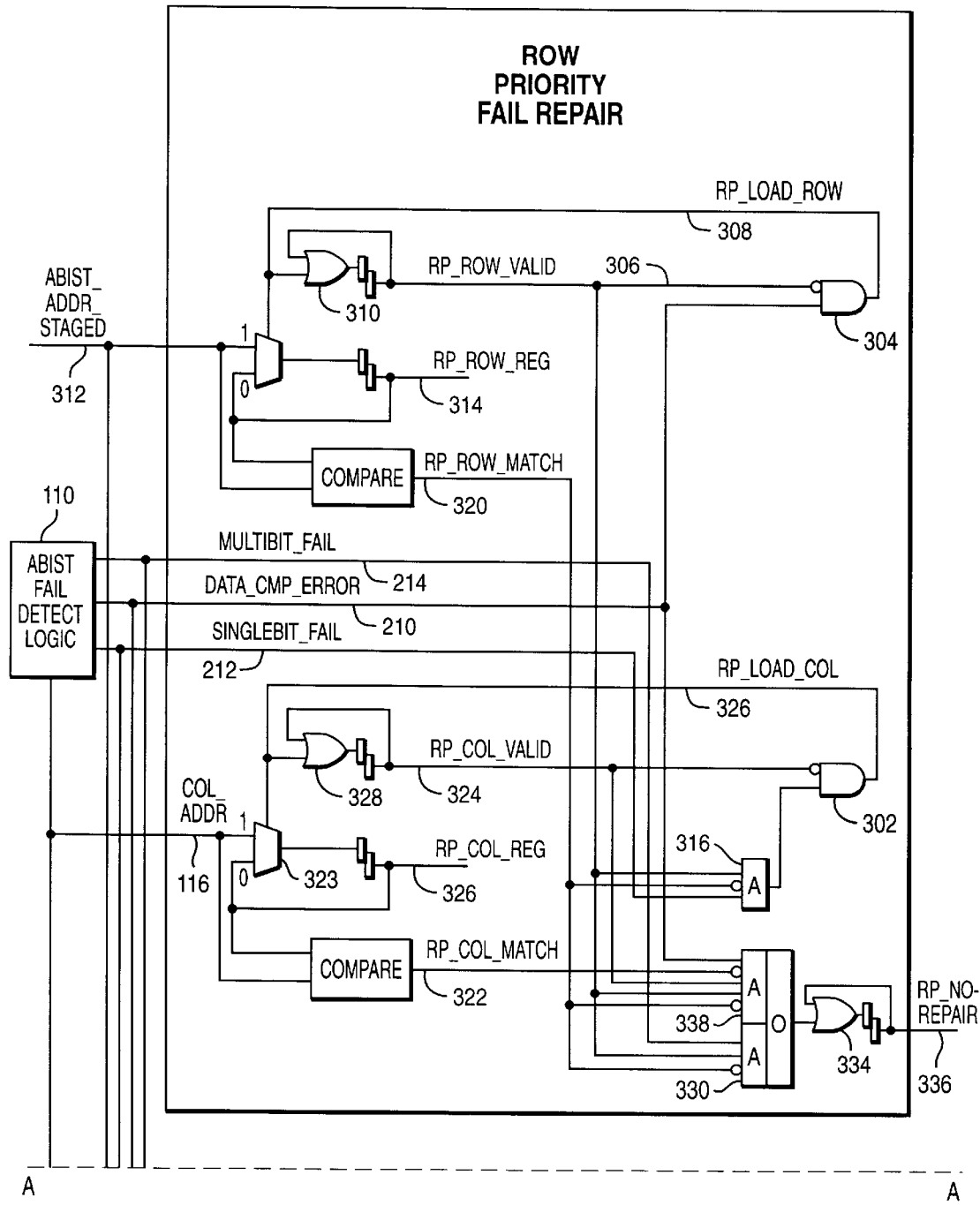
FIG. 3 shows a column and row redundancy repair detection logic.
Figure 3B:
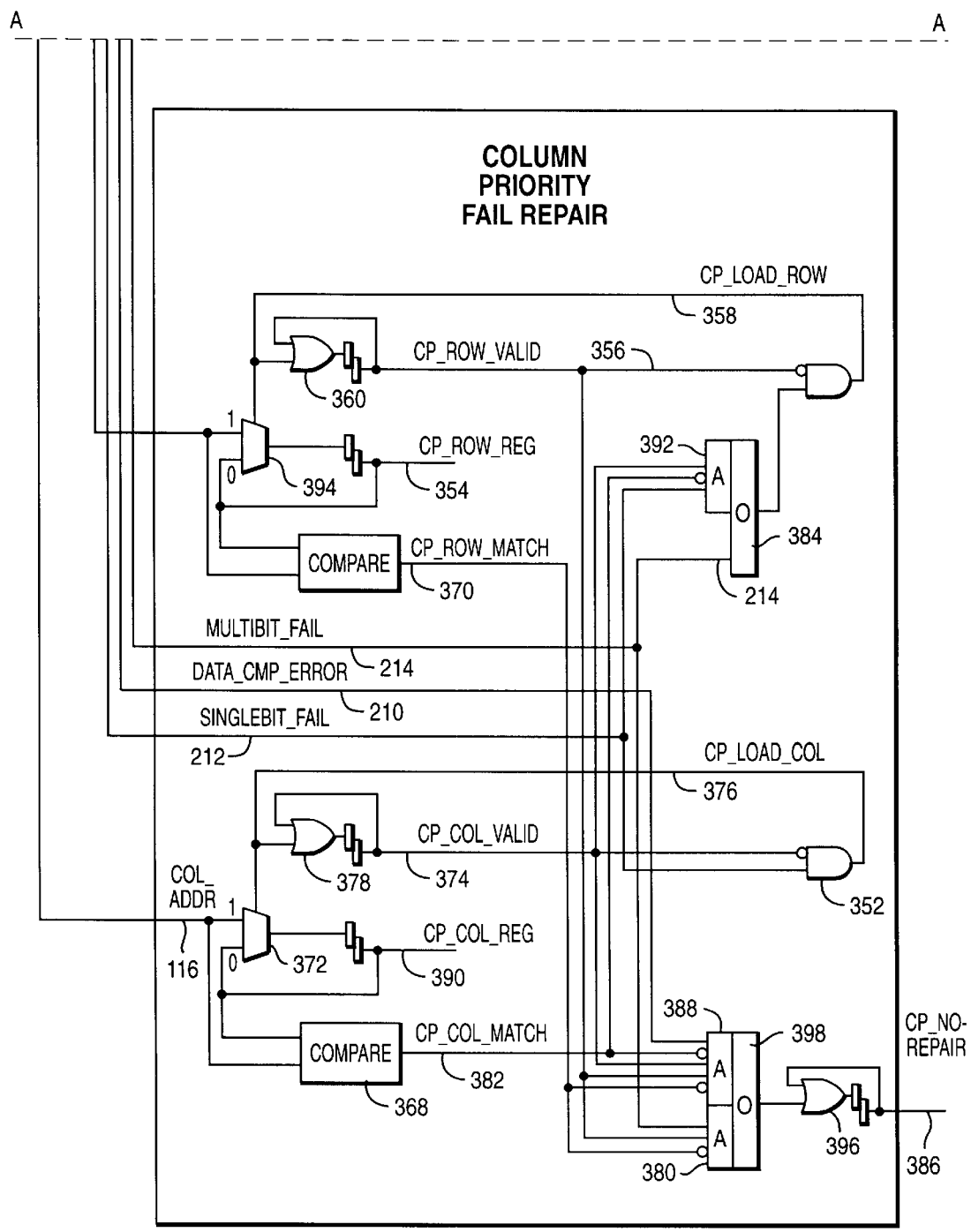
Figure 4A:
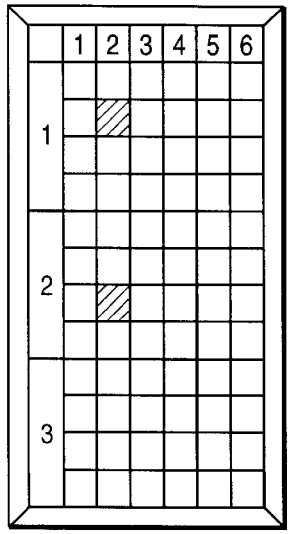
FIG. 4 shows several examples of array cell fail scenarios.
Figure 4B:
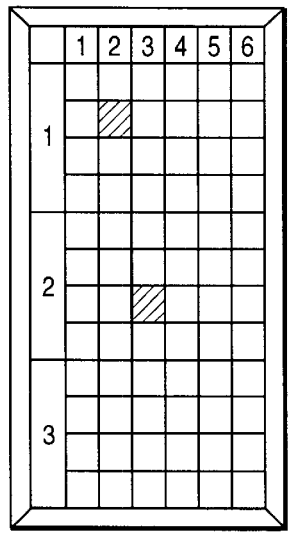
Figure 4C:
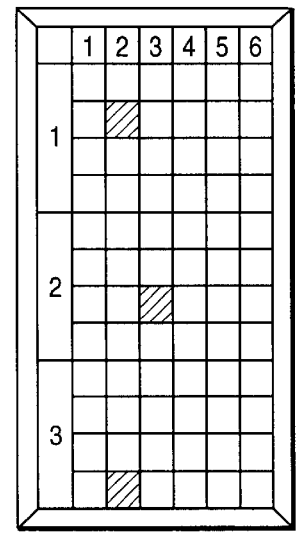
Figure 4D:
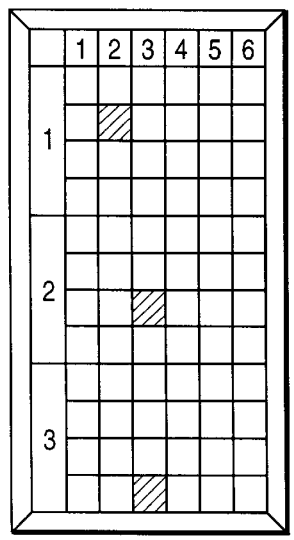
Figure 4E:
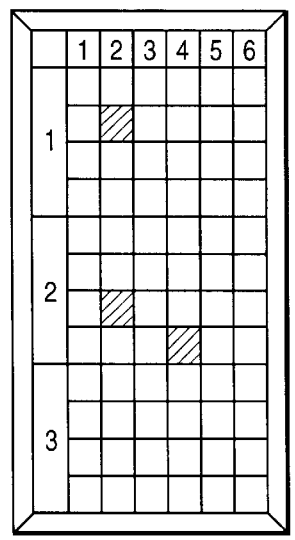
Figure 4F:
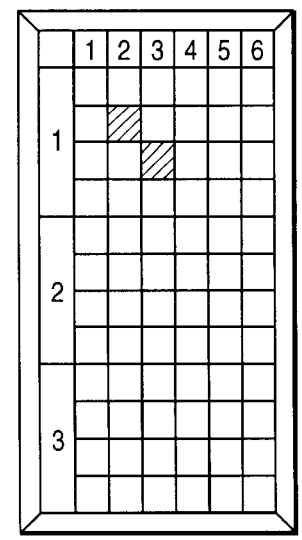
Figure 4G:
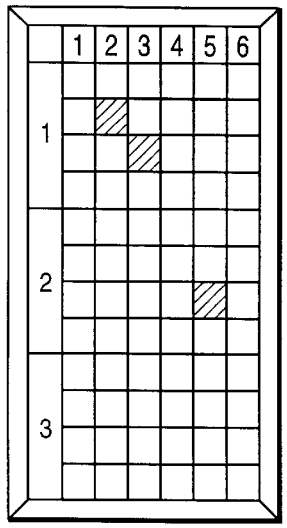
Figure 4H:
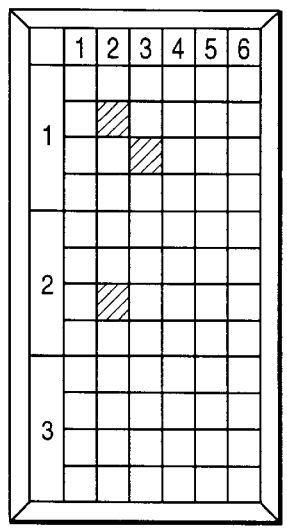
Figure 4I:
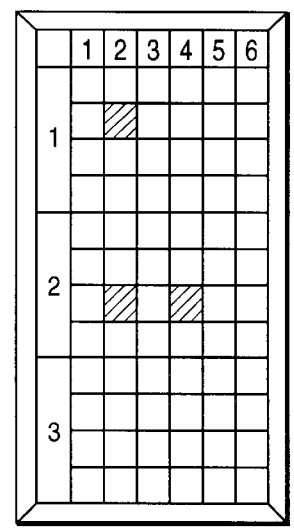
Figure 4J:
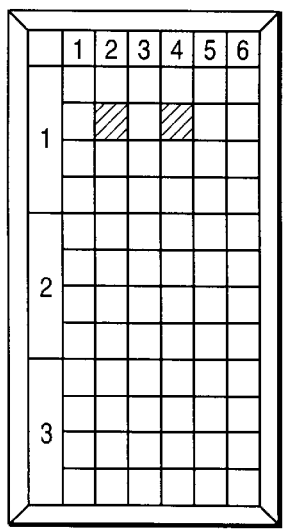
Figure 4K:
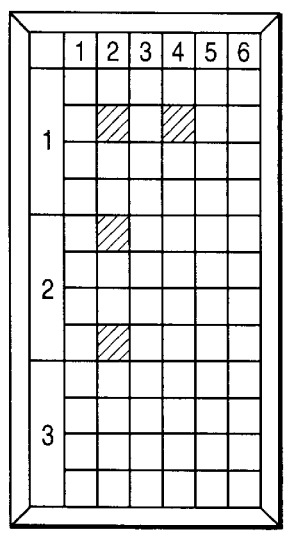
Figure 4L:
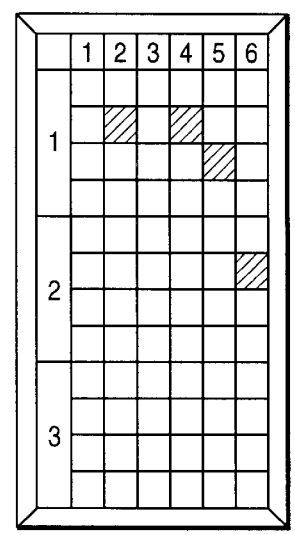
Figure 4M:
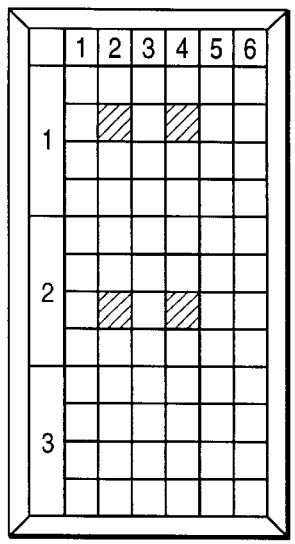
Figure 4N:
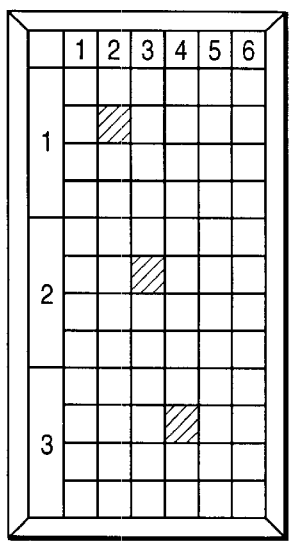
Figure 4O:
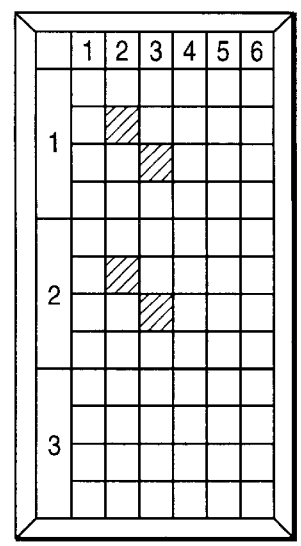
Figure 4P:
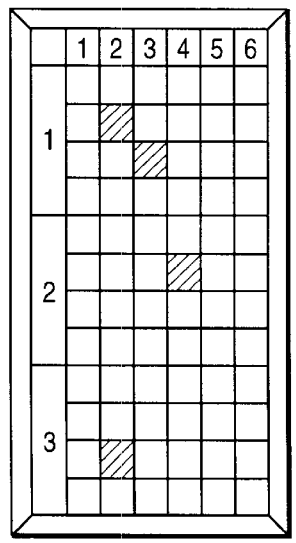

When the ABIST subsystem is in read mode, the ABIST data (though ignored by the array controller) is received by a comparitor 110. The comparitor 110 also receives the data latched in latch 106, and provides several output signals. The comparitor 110 provides a multibit signal 208, a single bit failed signal 212, a multibit failed signal 214, a data compare error signal 210, and a column address 116 to a functional replace logic, a portion of which is shown in FIG. 3.

Figure 2A:
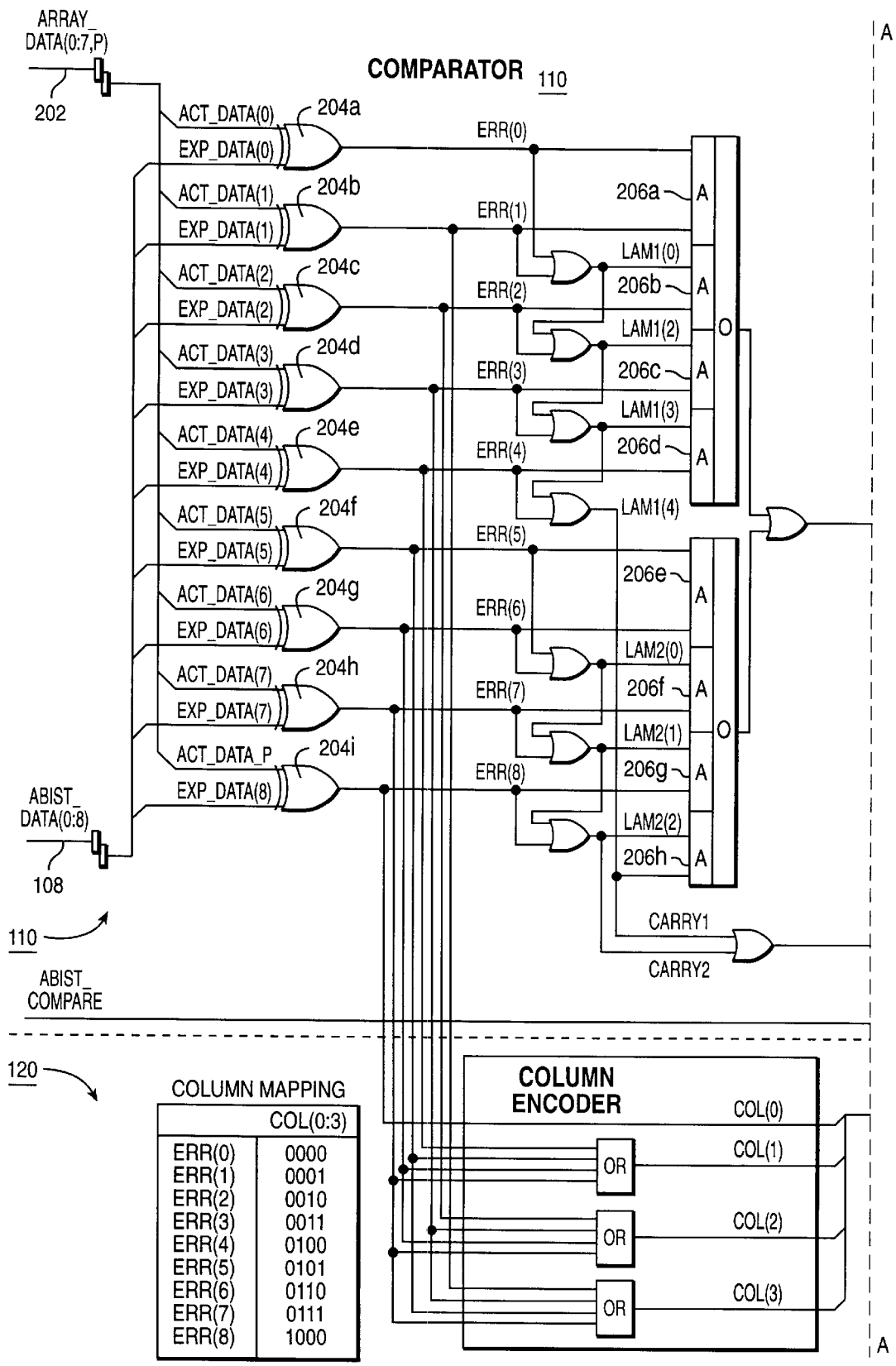
FIG. 2 shows a best fail detection logic for column repairable arrays, according to one embodiment of the present invention.
Figure 2B:
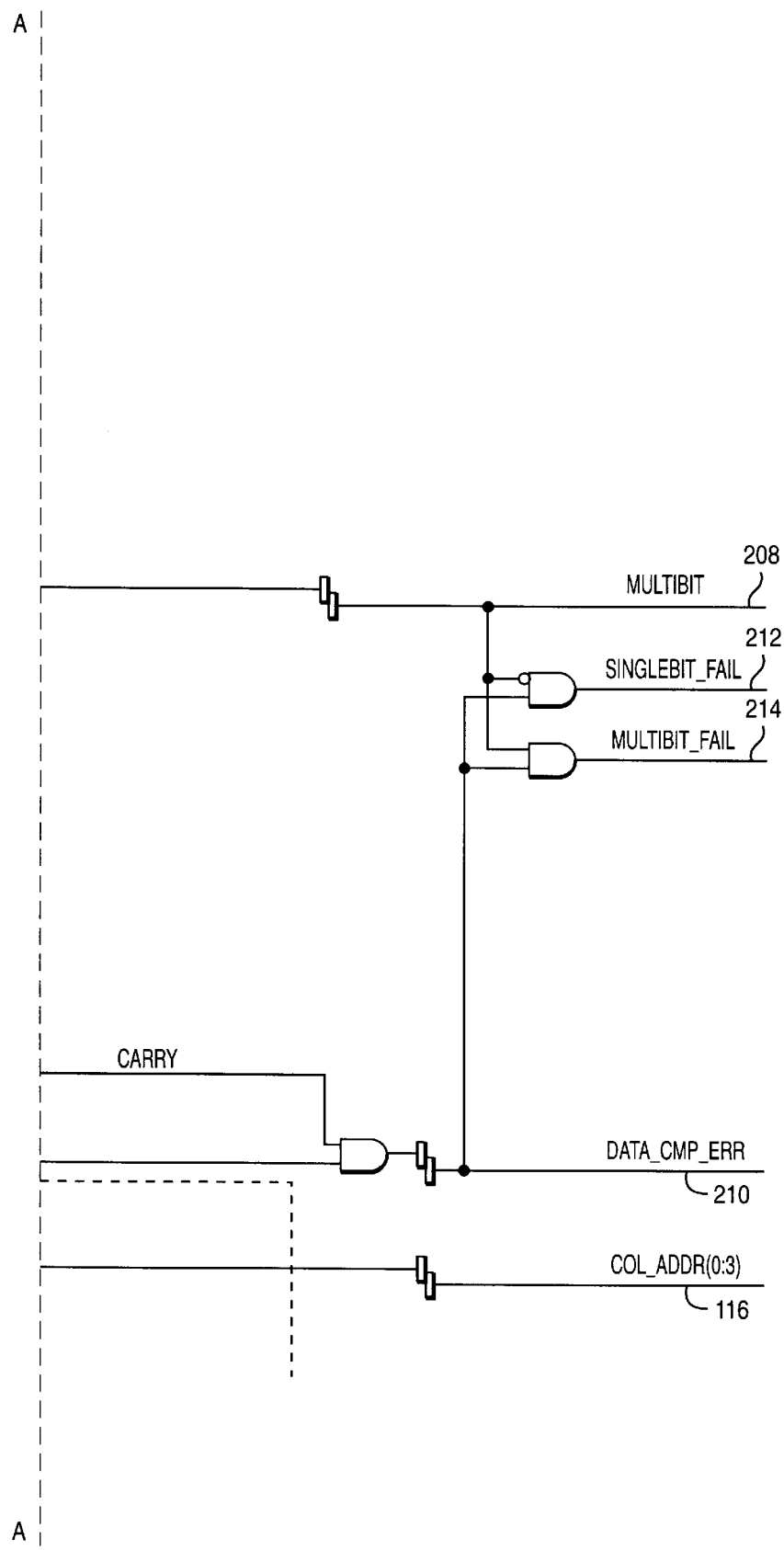

The single bit fail signal 212 from the comparitor 110 is also provided to an encoder 120. The comparitor 110 has both a data compare function and a multibit detection function, (not shown in FIG. 1). The comparitor 110 and the column encoder 120 of FIG. 1 are also shown in FIG. 2.

When the array data 202 (read from the array 104 via the latch 106) differs from the expected data 108 received directly from the ABIST engine 102 the encoder 120, attempts to identify the bit position in which the data differ. However, the output encoder 120 is only used by other logic when the single bit fail signal 212 is asserted, since only one bit position can be represented by the output of the encoder 120.

Array data 202 and expected data 108 each comprise a data word having a plurality of bits. The data compare function asserts a data compare error signal whenever array data 202 differs from its expected data 108, regardless of the number of bits that do not match. The multibit fail detection function, however, is concerned with the number of bits that do not match. When the number of non-matching bits exceeds one, then the multibit fail signal 214 is asserted and single-bit fail signal 212 is deasserted. When the number of non-matching bits is exactly one, then the multibit fail signal is deasserted and the single-bit fail signal is asserted.

When a single bit does not match, the encoder 120 indicates the position within the data 202 (and consequently within the data 108) of the non-matching bit. The output of the encoder 120 is latched, and provides the column address 116 identifying the bit position in which the data 202 read from array 104 differs from the ABIST data 108.

Concurrently, when the comparitor 110 indicates such an inequality (either multi-bit or singlebit) by asserting the data compare error signal 210, the row portion 112 of the ABIST address is latched. The latched row address 112 and the latched column address 116 are then provided to functional replace logic. A portion of the functional replace logic shown in FIG. 3, determines whether repair of the array is possible and, if so, how to proceed with the repair.

As shown in FIG. 1, the data comparison error signal 210 is used to gate a row address latch. A row address and a column address are supplied to other functions. These other functions are shown in FIG. 3.

FIG. 2 shows ABIST fail detection logic for column repairable arrays, including the comparitor 110 and the encoder 120, according to one embodiment of the present invention. A data function compares array data from the array 104 (shown in FIG. 1) with ABIST data 108. Array data 202 includes a number of bits taken from one row of the array 104. Concurrently, ABIST data 108 is also received by the ABIST fail detection logic. ABIST represents the data that is expected to be contained in the selected array row.

The ABIST fail detection logic performs a bit wise (bit-by-bit) comparison of the array data 202 and the ABIST data 108. The bitwise comparison is performed in a set of exclusive OR gates 204a through 204i. The number of exclusive OR gates necessary is equal to the number of bits in the selected row of the array 104. It is equal also to the number of bits in the ABIST data 108.

The ABIST data 108 is latched appropriately such that it arrives at the comparitor 110 concurrently with the array data that has been latched by latch 106 (FIG. 1).

Also shown in FIG. 2 the data compare function performs a multibit fail detection on the bitwise comparison of the array data 202 and ABIST data 108, and the multibit fail detection function receives the output signals from the various exclusive OR gates 204a–204i of the data comparison function. Using a set of AND gates 206a through 206h, each of which receives a different pair of the exclusive OR gate outputs, a multibit signal 208 is generated. The multibit signal 208 indicates whether more than one of the exclusive OR gates 204a through 204i has a high logical value. In other words, if the number of signals generated by the exclusive OR gates 204a through 204i is greater than 1, then the multibit signal 208 is set. If the number is exactly 1, then multibit signal 208 is cleared.

The ABIST fail detection logic of FIG. 2 also provides a data comparison error signal 210. The data comparison error signal 210 is a latched output of an AND gate that receives carry signals from the multibit fail detection function and also receives an ABIST compare signal. The data comparison error signal 210 gates a single bit fail signal 212 and a multibit fail signal 214, representing the multibit signal 208 in a different format. Carry signals indicate one or more bits miscompared. The carry signals are part of the output of the multibit fail detect logic. ABIST compare comes from ABIST engines indicating read data is valid.

The ABIST fail detection logic of FIG. 2 also includes a column encoder 120. The column encoder 120 receives the outputs of the exclusive OR gates 204a–204i and indicates which bit is set. When the output of more than one exclusive OR gate 204a–204i is set, then the output of the encoder 120 is not used, as shown in FIG. 3. When the output of only one of the exclusive OR gates 204a–204i is set, in other words when multibit signal 208 is clear, then the column address produced by encoder 120 is used by the, functional replace logic of FIG. 3. The output of the column encoder 120 is a binary column address signal 116 indicating which of the inputs to the column encoder is set.

FIG. 3 shows a column and row redundancy repair detection logic. The ABIST fail detection logic 110 (shown in FIG. 2) provides the multibit fail signal 214, the data comparison error signal 210, and the single bit fail signal 212. Whenever the n-bit array data 202 and the n-bit ABIST data 108 (both shown in FIG. 2) fail to equate identically with one another, a data comparison error signal 212 is generated. The data comparison error 210 is used in FIG. 3 to drive a variety of functions. The data comparison error signal 210 enables AND gate 304 to invert the rp_row_valid signal 306 and provide rp_load_row signal 308. Because the rp_row_valid 306 is initialized as clear, the assertion of the data comparison error signal 210 causes an asserted rp_load_row signal 308. The OR gate 310, receiving the asserted rp_load_row signal 308, provides an asserted output that is latched back onto the rp_row_valid signal 306. Because the rp_row_valid is also provided as a second input to OR gate 310, the asserted value on the rp_row_valid signal 306 remains asserted indefinitely.

Similarly, assertion of the rp_load_signal 308 selects the ABIST address staged signal 312 and drives the signal 312 to the rp_row_register signal 314. Like the rp_row_valid 306, the rp_row_register value 314 remains indefinitely. Once the rp_row_valid signal 306 is asserted, the AND gate 304 is disabled, driving its output, the rp_load_row signal 308 low and circulating the established value of the rp_row_register signal 314 through the multiplexer.

The row priority fail repair scheme does not attempt column repair for defective bits in a row for which row repair has already been successful. A compare block 318 determines whether an array row being examined for defective bits is a row for which row repair has already been successful. If row repair has been used, then rp_row_register 314 contains the row for which row repair has proven successful. ABIST addressed staged signal 312 contains the row currently being evaluated. Consequently, rp_row_match signal 320 is asserted when the present row has already been replaced through the row replacement portion of the row priority fail repair scheme. If the row repair portion of the row priority fail repair scheme has accomplished row repair, then AND gate 316 receives the rp_row_valid signal 306. AND gate 316 is also enabled by single bit fail signal 212 which is asserted (set) when exactly one bit in the array row undertest has failed, and is deasserted (clear) when multiple bits in the array row undertest have failed.

The output of AND gate 316 is thus asserted when the column repair portion of the row priority fail repair scheme should be attempted. The assertion of the output of AND gate 316 indicates that a valid row is stored in the row repair portion as indicated by the rp_row_valid signal 306, that the array row presently under evaluation does not match the row currently stored in the rp_row_register 314, and that a single bit fail has been detected in the array row under evaluation. When the output of AND gate 316 is asserted, the column repair portion of the row priority fail repair scheme is enabled.

The column portion of the row priority fail repair scheme receives a column address signal 116 from the ABIST fail detection logic 110 shown in FIG. 2. When no valid column is stored in the column repair portion, then the rp_column_valid signal 324 is deasserted, asserting the rp_load_column signal 326 via AND gate 302. The rp_load_column signal 326 allows the column address signal 116 to pass through multiplexer 322 for storage in the rp_column_register 326. Concurrently, the rp_load_column signal 326 sets the rp_column_valid signal 324 via OR gate 328. A feedback signal from the rp_column_valid signal 324 to the OR gate 328 prevents subsequent clearing of the rp_column_valid signal 324. Thus, once the rp_column_valid signal 324 is set, subsequent setting of the rp load column signal 326 is prevented, and no further column address signal 116 is allowed to pass through multiplexer 322 into the rp_column_register 326. Setting the rp column_valid signal 324 clears the rp_load_column signal 326.

Column repair is thus only attempted when row repair has failed. The assertion of the rp_row_valid signal 306 to AND gate 316 enables the column repair portion of the row priority fail repair scheme. The output of AND gate 316 permits the setting of the rp_load_column signal 326, which in turn allows a column address signal 316 to pass through multiplexer 322 into the rp_column_register 326. Once the column repair portion has been used, the rp_column_valid signal 324 remains asserted via the feedback to OR gate 328.

The row priority fail repair scheme also includes a no repair portion. The no repair portion determines whether a fail that is detected within an array row under evaluation is unrepairable. A fail is unrepairable when a first prior fail has been repaired by the row repair portion, and a second prior fail has been repaired via the column repair portion. Consequently, neither the row repair portion nor the column portion is available to repair the currently detected fail. Alternatively, a no repair situation can also arise despite the availability of the column repair portion, when a fail is of the multibit type and the rp_row_valid signal 306 is asserted.

AND gate 338 detects the former variety of situations, i.e., those in which neither the row portion nor the column portion is available to repair a current detected fail. When a fail is detected via the assertion of data compare error 210, the unavailability of the row repair portion and column repair portion is detected via rp_row_valid signal 306 and rp_column_valid signal 324, respectively. When this occurs, the inequality between the fail's row and the row stored in the row portion, and the inequality between the fail's column and the column stored in the column portion, are detected via the rp_row_match signal 320 and the rp_column_match signal 322, respectively. Either such inequality asserts the output of AND gate 328. The inclusion of the rp_row_match signal 320 and the rp_column_match signal 322 as inputs to the AND gate 328 potentially inhibits the assertion of the no repair signal 336 when an otherwise unrepairable fail has already been corrected by either the row repair portion or the column repair portion.

AND gate 330 detects the latter variety of unrepairable defective bits, i.e. those in which multiple defective bits are detected on the same array row, regardless of the availability of the column repair portion. When a multibit fail is detected via multibit fail signal 214, the unavailability of the row repair portion is detected via rp_row_valid signal 306 and the present row has not already been corrected in the row repair portion as indicated by the rp_row_match signal 320, then the output of AND gate 330 is asserted.

In either variety of unrepairable situations, the output of OR gate 334 is asserted. Asserting the output of OR gate 334 sets the rp_no_repair signal 336. Once set, the rp_no_repair signal 336 is not subsequently cleared. A feedback from the rp_no_repair signal 336 prevents subsequent clearing of the rp_no_repair signal 336, regardless of transitions in the output of the OR gate 334.

The column priority fail repair scheme also includes a no repair portion. The no repair portion determines whether a fail that is detected within an array column under evaluation is unrepairable. A fail is unrepairable when a first prior fail has been repaired by the column repair portion, and a second prior fail has been repaired via the row repair portion. Consequently, neither the column repair portion nor the row portion is available to repair the currently detected fail. However, a no repair situation can also arise despite the availability of the column repair portion, when a fail is of the multibit type and the cp_row_valid signal 356 is asserted. AND gate 388 detects the former variety of situations, i.e., those in which neither the column portion nor the row portion is available to repair a current detected fail. When a fail is detected via the assertion of data compare error 210, the unavailability of the column repair portion and row repair portion is detected via cp_column_valid signal 374 and cp_row_valid signal 356, respectively. When this occurs, the inequality between the fail's column and the column stored in the column portion, and the inequality between the fail's row and the row stored in the row portion, are detected via the cp_column_match signal 382 and the cp_row_match signal 370, respectively. Either such inequality asserts the output of AND gate 388. The inclusion of the cp_column_match signal 382 and the cp_row_match signal 370 as inputs to the AND gate 388 potentially inhibits the assertion of the no repair signal 386 when an otherwise unrepairable fail has already been corrected by either the column repair portion or the row repair portion.

AND gate 380 detects the latter variety of unrepairable defective bits, i.e. those in which multiple defective bits are detected on the same array row, regardless of the availability of the row repair portion. When a multibit fail is detected via multibit fail signal 214, the unavailability of the column repair portion is detected via cp_row_valid signal 356 and the present column has not already been corrected in the column repair portion as indicated by the cp_column_match signal 382, then the output of AND gate 380 is asserted.

In either variety of unrepairable situations, the output of OR gate 396 is asserted. Asserting the output of OR gate 396 sets the cp_no_repair signal 386. Once set, the cp_no_repair signal 386 is not subsequently cleared. A feedback from the cp_no_repair signal 386 prevents subsequent clearing of the cp_no_repair signal 386, regardless of transitions in the output of the OR gate 398.

Three examples illustrate the row priority fail repair scheme in operation. As shown in example A, of FIG. 4, two defective bits are situated in the same column, but in different rows of an array. When the first fail is detected in row 1, the various bits of row 1 are applied to the various exclusive OR gates 204a through 204i of FIG. 2. Concurrently, the various bits of the expected values for row 1 are applied to the other inputs to exclusive OR gates 204a through 204i via ABIST data signal 108. The multibit fail detection function shown in FIG. 2 clears the multibit signal 208 and the multibit fail signal 214 and asserts the single bit fail signal 212. The data compare error signal 210 is asserted, since the array data 202 is not identically equal to the expected array data 108, and the column address signal 116 contains a binary coded decimal representation of the number 2, since the detected fail is in the second column of the array.

Continuing with the example A illustrated in FIG. 4, the ABIST address staged signal 312 is received from the ABIST engine 102. The ABIST address staged signal 312 is, of course, timed to arrive at an appropriate moment. Also, the rp_row_valid signal 306 and the rp_column_valid signal 324 are initialized to a clear value of logical faults. The assertion of the data compare error signal 210, and the clear value on the rp_row_valid signal 306 assert the rp_load_row signal 308 via AND gate 304. The assertion of the rp_load_row signal 308 latches the ABIST address staged signal 312 into the rp_row_register 314 via multiplexer 338. The assertion of the rp_load_row signal 308 latches a set value into the rp_row_valid signal 306 via OR gate 310 and a feedback. Consequently, the row index "1" is latched into the rp_row_register 314. Concurrently, however, the column repair portion of the row priority fail repair scheme is disabled by the compare function 318. The rp_row_match signal 320 is asserted when the currently addressed row is the same row as is stored in the rp_row_register 314, and is applied to an inverted input to AND gate 316. Consequently, when the currently addressed row is the same as the row stored in the rp_row register 314, the column repair portion is disabled.

Continuing with Example A of FIG. 4, when the second fail is detected, a numerical value of "2" is applied to the ABIST address staged signal 312 since the second fail is in the second row. Because the row of the first detected fail is latched in the rp_row_register 314 and cannot be altered, the second fail produces a cleared or deasserted signal on the rp_row_match signal 320. Thus, although the second fail cannot alter the value stored in the rp_row_register 314, the inequality between the currently addressed array row and the index of the array row stored in the rp_row_register 314 enables the column repair portion. Upon detecting the second fail, the ABIST fail detection logic 110 asserts data compare error 210 and single bit fail signal 212 to AND gate 316, which together with the initialized clear value in the rp_column_valid signal 324 asserts the rp_load_column signal 326 via AND gate 302. Once asserted, the rp_load_column signal 326 latches the column address into the rp_column_register 326. The rp_load_column signal 326 also irrevocably sets the rp_column_valid signal 324 via OR gate 328 and a feedback.

Thus, in example A of FIG. 4, the row of the first fail is latched into rp_row_register 314, and the column of the second fail is latched into rp_column_register 326.

Figure 5C:
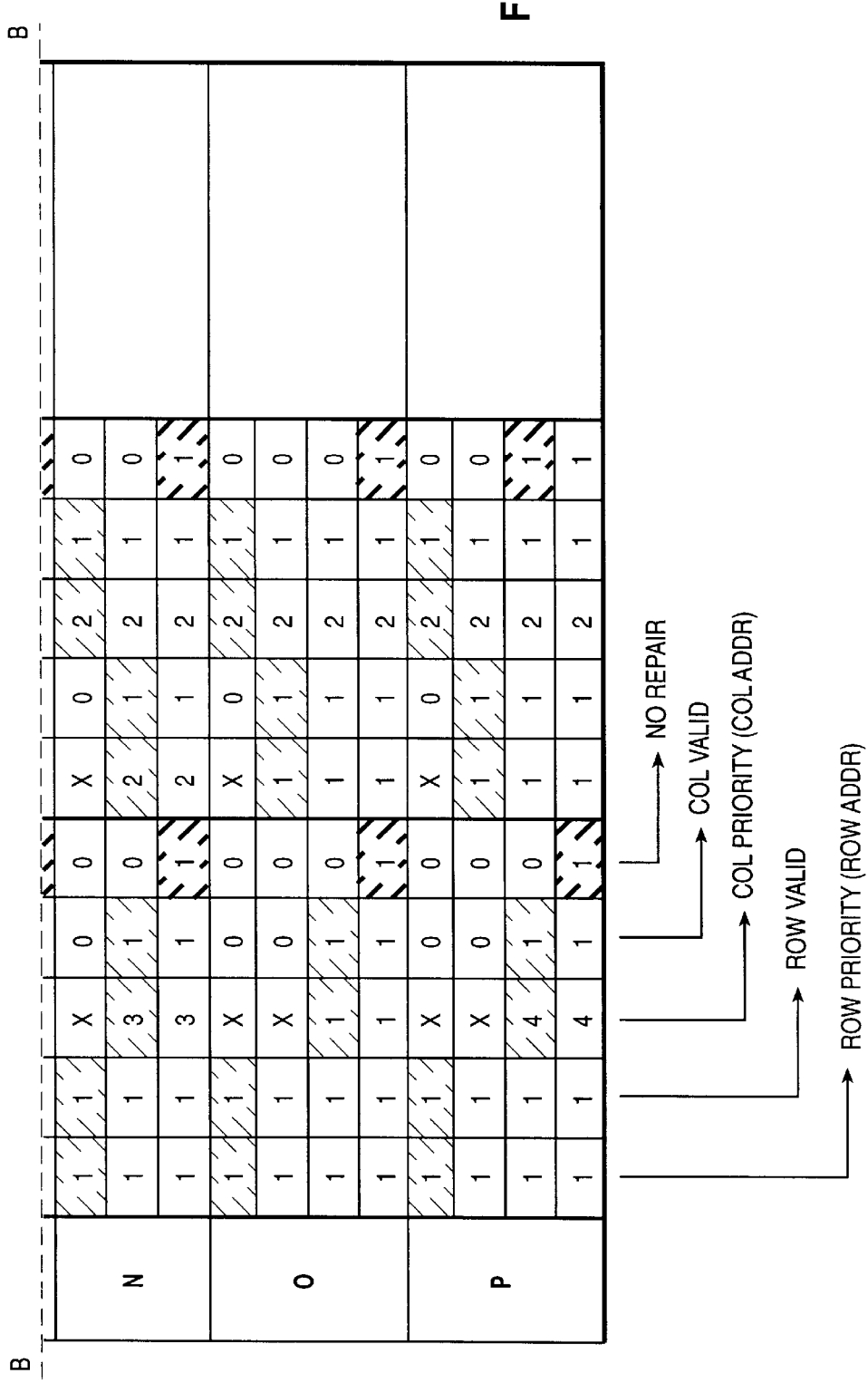
FIG. 5 further illustrates the array cell fail scenario examples of FIG. 4.

Example A is further illustrated in FIG. 5. Upon detecting the first fail, the rp_row_register 314 receives a value, as indicated by the 1 in the column abbreviated rpr. Also, the rp_row_valid signal 306 is set, as indicated by the 1 in the column labeled rv. No value is stored in the rp_column_register 326, as indicated in the column labeled rpc. The rp_column_valid signal 324 and the rp_no_repair signal 336 remain in their initialized clear states, as indicated in columns labeled cv and nr, respectively.

Upon detecting the second fail, the latched values in the rp_row_valid signal 306 and rp_row_register signal 314 are not affected, as indicated in the second row of Example A in FIG. 5. However, the temporary assertion of the rp_load_column signal 326 latches the column address signal 116 value into the rp_column_register 326 and concurrently sets the rp_column_valid signal 324, as indicated in the columns labeled rpc and cv, respectively. The rp_no_repair signal 336 remains in its initial cleared state.

The operation of the column priority fail repair scheme illustrates a great deal of symmetry with respect to the row priority fail repair scheme. The cp_column_valid signal 374 is initialized to a clear state. Upon the assertion of a single bit fail signal 212, AND gate 352 asserts the cp_load_column signal 376.

The assertion of the cp_load_column signal 376 latches column address signal 116 into the cp_column_register 390 via multiplexer 372. The cp_load column signal 376 also sets cp_column_valid signal 374, which is maintained in its set state by OR gate 378 and a feedback.

Because the array column of the first fail is equal on both the cp_column_register 390 and the column address signal 116, the cp_column_match signal 382 is asserted to AND gate 392, disabling the row repair portion of the column priority fail repair scheme.

Upon detecting a subsequent single bit fail, the compare function 368 determines whether the newly detected fail is in the same column as the column indexed in the cp_column_register 390. If so, the row repair function remains disabled; but if not, AND gate 392 is enabled.

AND gate 392 provides an asserted output once the cp_column_valid signal 374 is set already and a single bit fail is detected via single bit fail signal 212/and the stored cp_column_register 390 does not match the current failing column address 116. When this occurs, or when a multibit fail is detected on multibit fail signal 214, OR gate 384 enables the row repair portion of the column priority fail repair scheme.

If the row repair portion of the column priority fail repair scheme has not yet been used, then the cp_row_valid signal 356 is in its initialized clear state, allowing assertion of the cp_load_row signal 358. The ABIST address staged signal 312 is latched into the cp_row_register 354 via multiplexer 394, while the cp_row_valid signal 356 is set by OR gate 360 and a feedback. Once set, the cp_row_valid signal 356 prevents subsequent setting of the cp_load_row signal 358 and consequently prevents modification of the row index stored in the cp_row_register 354.

Example A of FIG. 4 shows the column priority fail repair scheme. Detection of the first fail causes the assertion of the data compare error 210 and the single bit fail signal 212 in clearing the multibit fail signal 214.

The initialized clear value of cp_column_valid signal 374, together with the single bit fail signal 212, asserts cp_load_column signal 376 and latch of value "2" from the column address signal 116 into the cp_column_register 390 via multiplexer 374. The cp_load_column signal 376 also sets the cp_column_valid signal 374 via OR gate 378, inhibiting subsequent assertion of the cp_load_column signal 376 via the inverted input into AND gate 352.

Because the same column is indicated on the column address signal 116 and the cp_column_register 390, the compare function 368 clears the cp_column_match signal 382 and thereby disables the row repair portion of the column priority fail repair scheme.

Upon detecting the second fail in Example A of FIG. 4, the column priority fail repair scheme does not modify any values. Having previously been set, the cp_column_valid signal 374 inhibits AND gate 352. Moreover, because the column indicated by the column address signal 116 matches the index of the column stored in the cp_column_register 390, the compare function 368 clears the cp_column_match signal 382 and thus inhibits AND gate 392.

The cp_column_valid signal 374 remains in its set state, the cp_column_match signal 382 remains in its cleared state, and the cp_column_register 390 continues to contain the column of the fail that was first detected. Assertion of the cp_column_match signal 382 disables AND gate 392, and the fact that the cp_row_valid signal 356 remains in its officialized clear state disables AND gate 380. Consequently, the cp_no_repair signal 386 remains in its initialized clear state.

The operation of the column priority fail repair scheme is further illustrated on the right hand portion of FIG. 5. Referring to Example A of FIG. 5, the detection of the first fail latches the column number into the cp_column_register 390 as illustrated in the column labeled cpc. The cp_column_valid signal 374 is set as indicated in the column labeled cv. The cp_row_register 354 remains in its initialized state, as indicated in the column labeled "CPR".

The cp_row_valid signal 356 and the cp_no_repair signal 386 remain in their initialized cleared states as indicated in the columns labeled RV and NR, respectively. The detection of the second fail does not alter these values, as described above. Although not shown in the Figures, a subsequent circuit serves to count the number of valid signals according to each of the priority fail repair schemes.

In Example A, the row priority scheme sets the rp_row_valid signal 306 upon detecting the first fail and sets the rp_column_valid signal 324 upon detecting the second fail, thereby setting two valid signals. However, the column priority fail repair scheme sets only the cp_column_valid signal 374 and not the cp_row_valid signal 356, thereby setting only one valid signal.

Accordingly, the column priority fail repair scheme is used in preference over the row priority fail repair scheme. The additional surplus rows remain available should a fail in a different column subsequently be detected.

A corresponding situation is encountered in Example J. Switching row and column references, one can analyze Example J.

A "no repair" situation is now described with reference to Example C in FIG. 4 and FIG. 5. As shown in FIG. 4, Example C contains two defective bits in the second column, and one fail in the third column. The two defective bits in the second column are, of course, in different rows, and neither is in the same row as the fail in the third column.

Upon detecting the first fail in Example C, the row priority fail repair scheme stores the ABIST address staged data 312 in the rp_row_register 314 and sets the rp_row_valid signal 306. The rp_column_valid signal 324 and the rp_column_register 326 remain in the initialized state since the assertion of the rp_row_match signal 320 disables AND gate 316 and therefore prevents assertions of the rp_load_column signal 326.

Within the column priority fail repair scheme, a value "2" representing the column of the first fail is latched into the cp column register 390, and the cp_column_valid signal 374 is set, by the assertion of the cp_load_column signal 376. The cp_load_column signal 376, it will be recalled, is provided by AND gate 352 when a single bit fail is detected on single bit fail signal 212 while the cp_column_valid 374 remains in its initialized state.

Through latching values into the cp__column__valid signal 374 and the cp__column__register 390, the column priority fail repair scheme does not modify either the cp__row__valid signal 356 or the cp__row__register signal 354 from their initialized values.

The operation of the column and row redundancy repair detection logic, both the row priority fail repair and the column priority fail repair scheme, in Example C, is illustrated in FIG. 5. The row priority fail repair scheme latches the ABIST address staged signal 312 into the rp__row__ register 314 and sets the rp__row__valid signal 306 as indicated in the rows labeled rpr and rv, respectively.

The row priority fail repair scheme does not modify the rp__column__register 326, the rp__column__valid signal 324, or the rp__no__repair signal 336 from their initialized values, as indicated in the rows labeled rpc, cv, and nr, respectively.

The detection of the first fail in Example C produces a corresponding response in the column priority fail repair scheme. The column of the first fail, represented on column address signal 316, is latched into the cp__column__register 390 and the cp__column__valid signal 374 is set, by the assertion of the cp__load__column signal 376, as indicated by the columns labeled cpc and cv, respectively.

The assertion of the cp__load__column signal 376 is provided by AND gate 352 in response to the assertion of the single bit fail signal 212 while the cp__column__valid signal 374 is in an initial state. No information is stored in the row portion of the column priority fail repair scheme, as this portion is disabled by cp__column__match signal 382.

Consequently, the row priority fail repair scheme stores the row of the first fail in rp__row__register 314, and does not store the column of the first fail, while the column priority fail repair scheme stores the column of the first fail in the cp__column__register 390, and does not store the row of the first fail.

Upon detecting the second fail in Example C, corresponding information is stored in the row and column priority fail repair schemes. Because the rp__row__valid signal 306 of the row priority fail repair scheme is already set, and because the row of the second fail as represented on ABIST address staged signal 312 differs from the row index stored on the rp__row__register 314 (clearing rp__row__match signal 320), AND gate 316 is able to produce an asserted output and AND gate 302 is able to assert rp__load__column signal 326.

The row priority fail repair scheme thus stores the column of the second fail in the column register 326 and sets the rp__column__valid signal 324 upon detecting the second fail.

Similarly, the column priority fail repair scheme stores the row of the second fail in the cp__row__register 354 and sets the cp__row__valid signal 356 upon detecting the second fail. Storage of the row information upon detecting the second fail is enabled by the deassertion of the cp__column__ match signal 382 to AND gate 392.

Thus, immediately before the third fail of Example C is detected, both the row and the column priority fail repair schemes are full. Despite this symmetry, the row priority and column priority fail repair schemes respond quite differently in response to the third fail.

Upon detecting the third fail, the compare function 318 of the row priority fail repair scheme compares the row of the third fail, represented on ABIST addressed staged signal 312, with the row index latched in the rp__row__register 314, and asserts rp__row__match signal 320. The assertion of the rp__row__match signal 320 indicates that the row priority fail repair scheme is unable to use row repair, in that the row repair register 314 is full and the newly detected fail is in a different row.

However, the row priority fail repair scheme is also unable to store the column of the newly detected fail in the rp__column__register 326, because the rp__column__register 326 already has a value stored, and the newly detected fail is in a different column than that represented in the rp__column__register 326. This is extremely problematic for the row priority fail repair scheme in that the newly detected fail is in a different row from that stored in the row portion, and in a different column from that stored in the column portion. Consequently, the row priority fail repair scheme is forced to assert the rp__no__repair signal 336.

In Example C, the column priority fail repair scheme, does not suffer the same disability. Although values are already stored in the cp__row__register 354 and the cp__column__register 390, the compare function 368 recognizes that the newly detected fail is in the same column as that indicated in the cp__column__register 390. Consequently, the repair function 368 asserts rather than deasserts, the cp__column__match signal 382.

Assertion of the cp__column__match signal 382 inhibits AND gate 392, while the absence of a multibit fail inhibits AND gate 380. Thus, the row priority fail repair scheme asserts a no repair signal 336, while the column priority fail repair scheme does not assert a no repair signal 386.

Within the subsequent processing logic that counts the number of valid signals asserted, an exclusive OR between the no repair signals 336 and 386 disables the counter and enable the priority fail repair scheme selector directly. The counter is only enabled when the no repair signal 336 and the no repair signal 386 are both zero.

Figure 6:
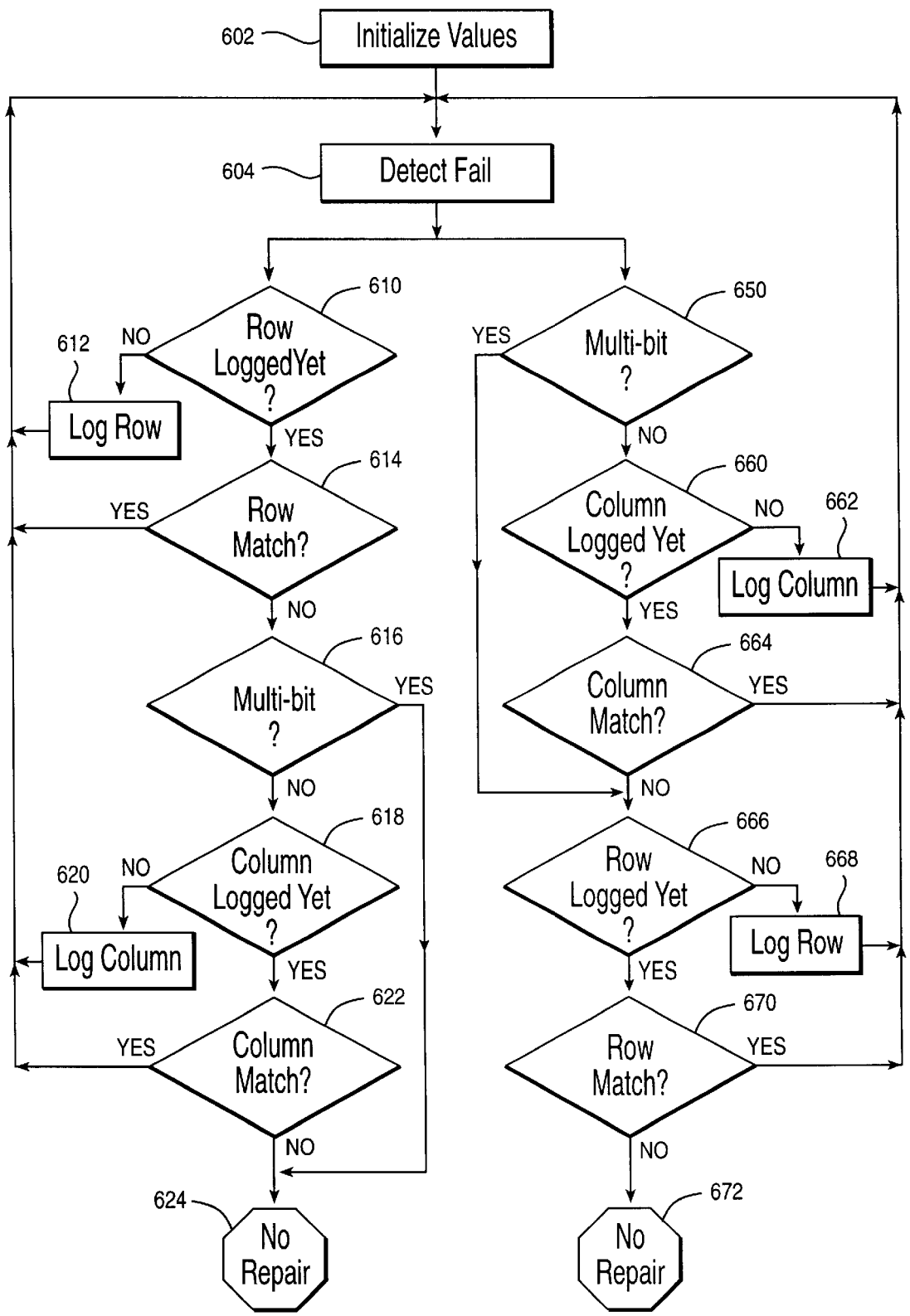
FIG. 6 shows a method of repair according to one embodiment of the present invention.

FIG. 6 shows a method according to one embodiment of the present invention. At step 602, various registers and signals are initialized to the value of zero. At step 604, a fail is detected.

The processing flow then branches to two parallel and concurrent streams, beginning with steps 610 and 650, respectively. At step 610, a check is made to determine whether a row has already been logged. If no row has yet been logged, the row is logged in the row priority fail repair scheme. The row priority fail repair scheme, following step 612, transitions to an idle state until a new fail is detected at step 608.

In parallel with the row priority fail repair scheme, a column priority fail repair scheme begins. At step 650, if the fail is a multibit fail, control proceeds to step 666, otherwise, control proceeds to step 660. At step 660, upon detecting a new fail, a check is made to determine whether a column has already been logged. If a column has not yet been logged, then the column of the new fail is logged, and the column priority fail repair process transitions to an idle state until yet another fail is detected. This occurs at steps 662.

If the row priority fail repair process determines a row has already been logged, a comparison is made between the row of the newly detected fail with the row in the log. At step 614, if the row of the newly detected fail matches the row already logged in the row priority fail repair scheme process, then the row priority fail repair process transitions to the idle state until a new fail is detected at step 608.

If a column has already been logged, as determined in step 660, then at step 664, a determination is made whether the column of the recently detected fail is equal to the column that has been logged. If the two columns are identical, then a repair accounting for the newly detected fail has already been made, and the column priority fail repair process transitions to an idle state until yet another fail is detected.

At step 616, a check is made to determine whether the fail is in a single bit of the row or whether the fail is in several bits of the row. If exactly one bit of the row defective bits, then at step 618 a check is made to determine whether a column has already been logged.

If no column has already been logged, then the row priority fail repair process logs the column of the newly detected fail, and transitions to the idle state until yet another fail is detected; in other words, control passes to step 608. This occurs at step 620.

If at step 618 a determination is made that a column has already been logged, then at step 622 a check is made to determine whether the column of the newly detected fail is equal to the column that has already been logged. If the columns match at step 622, then the row priority fail repair process passes to the idle state awaiting yet another fail and passing control to step 608.

If the row priority fail repair scheme has already logged a column but the logged column differs from the column of the newly detected fail, then the row priority fail repair process issues a no repair signal. Also, if control passes through step 610 and 614 and then a multibit fail is detected at step 616, then a no repair signal is issued at step 624.

If at step 664 the column priority fail repair process determines that a column has been logged but does not match the column of the newly detected fail, then at step 666 a check is made to determine whether a row has been logged yet. If no row has yet been logged, then at step 668 the row is logged and the column priority fail repair process passes into an idle state until yet another fail is detected and control passes again to step 608.

If the rows do not match at step 670, then a no repair signal is issued at step 672.

At step 650, a determination is made as to whether more than one bit of the row under evaluation has failed. If exactly one bit of the row has failed, then control passes to step 660.

If at step 650, a determination is made that more than one bit of the row currently under evaluation has failed, then control passes to step 666.

Other Ways of Using ABIST for Redundancy

One novel approach to the allocation of replacement rows and columns among the various detected defective bits in an array is to map all of the defective bits in a table residing in software. Once the ABIST engine has completed its operation and the locations of all detected defective bits have been recorded in software, a software program can optimize the row and column replacement assignments.

Software can be used to create a table of all defects and then iterate through the entire table three times. In the first iteration, the software determines whether the number and location of defective bits would even allow repair.

In the second iteration, the software identifies rows or columns containing multiple defective bits, and attempts to assign replacement rows or columns optimally. "Must repair" flags are set where multiple defective bits share a column or row, optimally allowing assignment of replacement rows and columns to accommodate multiple defective bits. "Redundant" defective bits, which share a row with a first other fail and a column with a second other fail, are marked when discovered but not repaired until the third iteration.

Then, in the third iteration, any other replacement rows or columns are assigned to the remaining (i.e., isolated or "sparse") defective bits.

By including all lines and elements in a pseudo-repair operation, a table is generated identifying all array and redundant lines having any defective bits as "must fix" lines or lines having "sparse defective bits". The result of a pseudo-repair operation is shown below for the m by n array and its 4 column by 4 row lines of redundancy shown in the Figure.

|             | SPARSE (SP) |        |
| MUST FIX (MF) | ROW | COLUMN |
| --- | --- | --- |
| R1 | R3 | Ca |
| C2 | Rb | C4 |
|    | Rd | Cd |

Any redundant location which appears in the MF table is immediately known to be unusable in a repair. Redundant locations appearing in the SP table require more analysis and allow the test operator flexibility in his repair solution. The maximum number of entries in the MF table (TMF) and the SP table (TSP) are as follows: TMF=Rs Cs and TSP=2RsCs, where Rs is the number of spare rows and Cs is the number of spare columns.

In this case, where faults were found in the redundancy but degree of availability or redundancy is identified, the repair algorithm is then run on the main array. The device shown is repairable and solutions exist which can make use of all of the redundant lines. Redundant lines Cb, Cc, Ra, and Rc can be used to make a repair anywhere in the main array. Either Cd or Rd, but not both, could be used in a repair. Ca and Rb could also be used in a repair, provided another line in the opposite dimension is also used at the appropriate location to remove the single cell fail on each line.

No further testing is needed when the results of the pseudo-repair are: 1) no faults are found in the redundancy-the repair solution found in the pseudo-repair is applicable to the main array, and 2) the region of memory is unfixable-the device or region may immediately be labeled unfixable.

However, software has several serious limitations. While this may be an effective method, it requires the operation of software, and the dedication of a processor during ABIST. Because ABIST normally operates either within a manufacturing facility, or with an end user, upon powering-up a system, the processor may not have access to all the arrays prior to system configuration. Moreover, for the software to store the locations of the detected defective bits, the software must itself use an array, which may contain defective bits of its own. Software generally operates much more slowly than hardware, and given the number of arrays in a typical system can take quite while.

By using a conventional repair algorithm to test and bit map a standard memory array, inclusive of its two-dimensional redundant lines and elements, n level of usefulness of the redundant lines and elements is determined. This pseudo-repair operation identifies redundant lines falling into catagories of "must fix" and "sparse" condition in a single run. Frequently, sufficient information is thereby provided to an operator so that incorrect identification of a fixable array as unfixable is avoided.

Colunmn v. Row Redundancy

Column redundancy in many architectures is preferable to row redundancy. Memory arrays, for example, are frequently implemented with columns of array cells connected to common bit lines, and rows of array cells connected to common word lines. In the HARPNP arrays, experience has shown that memory cells tend to interact more strongly with the bit lines than the word lines.

A bad cell tends to ruin the whole bit column more than it affects the whole word line. Also the bit column control circuits for sense, write and select are very complex and have to be packed into a very narrow pitch, contributing to a higher frequency of bit line failures. All these are consistent with the fact that in the HARPNP products, bit defective bits are prevailing over word defective bits.

Nevertheless, row repair, or "horizontal" repair as it is commonly known, is easier to implement and therefore more common. All the bits of a word are typically received adjacently along with parity and error-detection bits. To detect errors in columns, correspondingly-located bits belonging to multiple words had to be collected and analyzed, which became even more difficult as word-lengths became variable.

For example, when memory array redundancy was introduced, it was supplied to arrays of fixed data width. The 9/10 bit redundancy scheme had been used in many older products, where the data path was nine bits wide, and a tenth spare bit column was provided for repair purpose. When the high-end arrays became more complex with variable configurations, the data path was no longer of fixed width, and the 8/9 word redundancy was then applied. This horizontal repair technique was further extended to group repair, where any five single word lines can be repaired from five spare word lines.

Despite the widespread application of row replacement methods in array repair, column redundancy is actually less costly in power and performance. Arrays with additional rows and columns for redundancy require additional drivers and some drivers will go unselected. However, unselected word line drivers actually dissipate more power than the selected word line driver, while unselected bit line drivers dissipate no power at all; spare bit column circuits are power-free.

Also, more word lines add to the cell back injections, wasted power that also slows down the HARPNP array access.

Therefore, column redundancy is much more preferable to the conventional word redundancy scheme that has been used in the high-end arrays for many years.

Partially Good Arrays

It should be noted that, even where replacement is not possible, the array may not be entirely without value. Partially good DCU logic modules have been used in reduced-cost and low-performance systems.

The foregoing is presented for exemplary purposes only, and should not be construed as limiting the scope of the invention.

What is claimed is:

1. An apparatus configured to receive a series of locations, each location comprising both a row address and a column address of a distinct fault detected within an array, the apparatus comprising:

a row replacement priority circuit, configured both to mark a row containing a first fault in the series for row replacement, and to mark a column containing a subsequent fault for column replacement when the subsequent fault is in an unmarked row;

a column replacement priority circuit, configured both to mark a column containing a first fault in the series for column replacement, and to mark a row containing a subsequent fault for row replacement when the subsequent fault is in an unmarked column and the fault is amenable to column replacement.

2. The apparatus of claim 1, wherein:

the row replacement priority circuit is configured to receive concurrently both the row address and the column address of a location in the series; and a column replacement priority circuit, configured to receive concurrently both the row address and the column address in parallel with the row replacement priority circuit.

3. The apparatus of claim 1, wherein:

the row replacement priority circuit further comprises a row portion configured to store the row address when no row address has yet been stored; and the row replacement priority circuit also further comprises a column portion configured to store the column address when (1) a row address has been stored, (2) no column address has been stored, and (3) the row address is unequal to the stored row address.

4. The apparatus of claim 1, wherein:

the row replacement priority circuit further comprises a "row no repair" portion configured to set a "row no repair" flag when and only when (1) a row address has been stored, (2) a column address has been stored, (3) the row address is unequal to the stored row address, and (3) the column address is unequal to the stored column address.

5. The apparatus of claim 1, wherein:

the column replacement priority circuit further comprises a column portion configured to store the column address when no column address has yet been stored; and a row portion of the column replacement priority circuit, configured to store the row address when (1) a column address has been stored, (2) no row address has been stored, and (3) the column address is unequal to the stored column address; or (1) when no address has been stored, and (2) the fault is a multibit fault.

6. The apparatus of claim 1, wherein:

the column replacement priority circuit further comprises a "column no repair" portion configured to set a "column no repair" flag when and only when (1) a row address has been stored, (2) a column address has been stored, (3) the row address is unequal to the stored row address, and (3) the column address is unequal to the stored column address.

7. The apparatus of claim 1, further comprising:

a "row no repair" portion of the row replacement priority circuit, configured to set a "row no repair" flag when and only when (1) a row address has been stored, (2) a column address has been stored, (3) the row address is unequal to the stored row address, and (3) the column address is unequal to the stored column address;

a "column no repair" portion of the column replacement priority circuit, configured to set a "column no repair" flag when and only when (1) a row address has been stored, (2) a column address has been stored, (3) the row address is unequal to the stored row address, and (3) the column address is unequal to the stored column address; and a selector circuit, configured to determine whether both the "column no repair" flag and the "row no repair" flag are set, to determine which of the "column no repair" flag and the "row no repair" flag is set when exactly one of the "column no repair" flag and the "row no repair" flag is set, and to determine which of the column replacement priority circuit and the row replacement priority circuit contains the greater number of stored addresses when neither the "column no repair" flag nor the "row no repair" flag is set.

8. A method including receiving a series of locations, each location comprising both a row address and a column address of a distinct fault detected within an array, the method comprising:

row replacement prioritizing, including both marking a row containing a first fault in the series for row replacement, and marking a column containing a subsequent fault for column replacement when the subsequent fault is in an unmarked row;

column replacement prioritizing, including both marking a column containing a first fault in the series for column replacement, and marking a row containing a subsequent fault for row replacement when the subsequent fault is in an unmarked column and the fault is amenable to column replacement.

9. The method of claim 8, wherein:

the row replacement prioritizing includes receiving concurrently both the row address and the column address of a location in the series; and column replacement prioritizing, including receiving concurrently both the row address and the column address in parallel with the row replacement prioritizing.

10. The method of claim 8, wherein:

the row replacement prioritizing further comprises row logging including storing the row address when no row address has yet been stored; and the row replacement prioritizing also further comprises column logging including storing the column address when (1) a row address has been stored, (2) no column address has been stored, and (3) the row address is unequal to the stored row address.

11. The method of claim 8, wherein:

the row replacement prioritizing further comprises "row no repair" evaluating including setting "row no repair" flag when and only when (1) a row address has been stored, (2) a column address has been stored, (3) the row address is unequal to the stored row address, and (3) the column address is unequal to the stored column address.

12. The method of claim 8, wherein:

the column replacement prioritizing further comprises column logging including storing the column address when no column address has yet been stored; and row logging of the column replacement prioritizing, including storing the row address when (1) a column address has been stored, (2) no row address has been stored, and (3) the column address is unequal to the stored column address; or (1) when no row address has been stored, and (2) the fault is a multibit fault.

13. The method of claim 8, wherein:

the column replacement prioritizing further comprises "column no repair" evaluating including setting "column no repair" flag when and only when (1) a row address has been stored, (2) no column address has been stored, (3) the row address is unequal to the stored row address or (1) when no row address has been stored and (2) the fault is a multibit fault.

14. The method of claim 8, further comprising:

"row no repair" evaluating of the row replacement prioritizing, including setting "row no repair" flag when and only when (1) a row address has been stored, (2) a column address has been stored, (3) the row address is unequal to the stored row address, and (3) the column address is unequal to the stored column address;

"column no repair" evaluating of the column replacement prioritizing, including setting "column no repair" flag when and only when (1) a row address has been stored, (2) a column address has been stored, and (3) the row address is unequal to the stored row address, or (1) when no row address has been stored, and (2) the fault is a multibit fault;

selecting, including determining whether both the "column no repair" flag and the "row no repair" flag are set, determining which of the "column no repair" flag and the "row no repair" flag is set when exactly one of the "column no repair" flag and the "row no repair" flag is set, and determining which of the column replacement prioritizing and the row replacement prioritizing contains the greater number of stored addresses when neither the "column no repair" flag nor the "row no repair" flag is set.

* * * * *